United States Patent
Kim et al.

(10) Patent No.: US 7,011,981 B2
(45) Date of Patent: Mar. 14, 2006

(54) METHOD FOR FORMING THIN FILM AND METHOD FOR FABRICATING LIQUID CRYSTAL DISPLAY USING THE SAME

(75) Inventors: Soo Kil Kim, Seoul (KR); Jong Uk Bae, Seoul (KR); Jae Jeong Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 43 days.

(21) Appl. No.: 10/771,292

(22) Filed: Feb. 5, 2004

(65) Prior Publication Data

US 2004/0157352 A1 Aug. 12, 2004

Related U.S. Application Data

(62) Division of application No. 09/985,342, filed on Nov. 2, 2001, now Pat. No. 6,706,628.

(30) Foreign Application Priority Data

Nov. 13, 2000 (KR) ................................ 2000-67200

(51) Int. Cl.
*H01L 21/00* (2006.01)
*H01L 21/3205* (2006.01)
*H01L 21/44* (2006.01)

(52) U.S. Cl. .................... 438/20; 438/30; 438/586; 438/678; 438/687

(58) Field of Classification Search ................ 438/22, 438/30, 586, 678, 687, 688
See application file for complete search history.

(56) References Cited

U.S. PATENT DOCUMENTS

| 6,008,065 | A * | 12/1999 | Lee et al. ................ 438/30 |
| 6,297,441 | B1 | 10/2001 | Macris |
| 6,403,481 | B1 | 6/2002 | Matsuda et al. |
| 2002/0000382 | A1 | 1/2002 | Morrissey et al. |

FOREIGN PATENT DOCUMENTS

EP 1 005 078 A1 5/2000

* cited by examiner

*Primary Examiner*—Ha Tran Nguyen
(74) *Attorney, Agent, or Firm*—McKenna Long & Aldridge LLP (57) ABSTRACT

A method for forming a thin film and a method for fabricating a liquid crystal display device using the same are provided. The method provides a process that is simplified. Uniform thin film characteristics can be obtained. The method for forming a thin film includes the steps of forming a diffusion barrier film on a substrate, forming a metal seed layer on the diffusion barrier film, removing a metal oxide film formed on a surface of the metal seed layer using an electric plating method, and depositing metal on the metal seed layer in which the metal oxide film is removed.

10 Claims, 7 Drawing Sheets

METHOD FOR FORMING THIN FILM AND METHOD FOR FABRICATING LIQUID CRYSTAL DISPLAY USING THE SAME

This application is a divisional of prior application Ser. No. 09/985,342, filed Nov. 2, 2001 now U.S. Pat. No. 6,706,628.

This application claims the benefit of Korean Patent Application No. 2000-67200 filed on Nov. 13, 2000, which is hereby incorporated by reference as if fully set forth herein.

BACKGROUND OF THE INVENTION

1. Field of the Invention

The present invention relates to a method for forming a thin film, and more particularly, to a method for forming a thin film and a method for fabricating a liquid crystal display device using the same, in which a process is simplified and uniform thin film characteristic can be obtained.

2. Discussion of the Related Art

Traditionally, an aluminum or its alloy has been used as a line material of a semiconductor device or a liquid crystal display device. Recently, there has been an increase in the use of copper having excellent electric conductivity as the line material in semiconductor device and liquid crystal display devices instead of aluminum.

A related art method for forming a copper thin film uses either a Plasma Vapor Deposition (PVD) method based on sputtering or a Chemical Vapor Deposition (CVD) method regardless of whether the semiconductor or liquid crystal display device has a glass substrate or a silicon substrate. These methods have a problem in that a wet chemical process is required, and therefore additional complicated processes, such as removing, washing, and drying, are required.

A related art method for forming a copper thin film will be described with reference to the accompanying drawings.

FIGS. 1a to 1d are sectional views illustrating a related art method for forming a copper thin film.

Figure 1A:
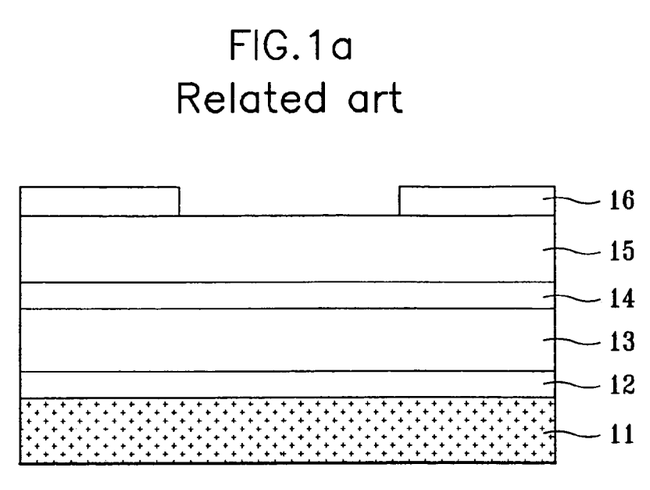
FIGS. 1a to 1d are sectional views illustrating a related art method for forming a copper thin film.

As shown in FIG. 1a, a barrier layer 12 is formed on a substrate 11, and a first metal layer 13, an insulating layer 14 and a dielectric layer 15 are sequentially deposited on the barrier layer 12. A silicon substrate is used for a semiconductor device or a glass substrate is used for a liquid crystal display device.

A photoresist is deposited on the dielectric layer 15 and then patterned by exposure and developing processes. Thus, a photoresist pattern 16 is formed to selectively expose a surface of the dielectric layer 15.

Figure 1B:
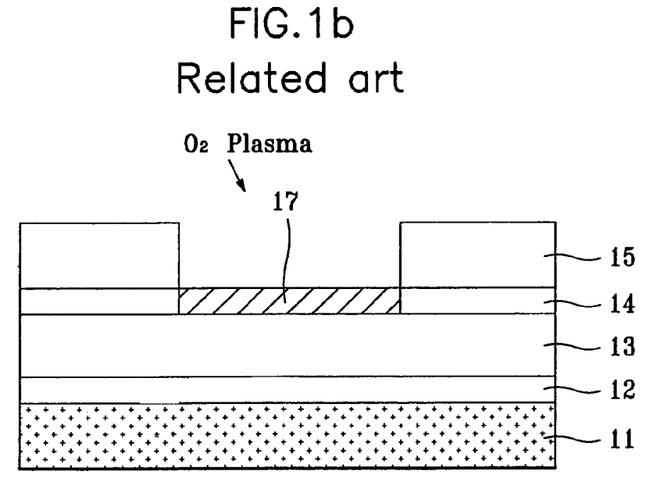

Subsequently, as shown in FIG. 1b, the dielectric layer 15 is selectively removed by an etching process using the photoresist pattern 16 as a mask to partially expose a surface of the insulating layer 14. Then, $O_2$ plasma process is performed in such a manner that $O_2$ gas is permeated into the insulating layer 14 to react with the first metal layer 13. As a result, a metal oxide 17 is formed.

Figure 1C:
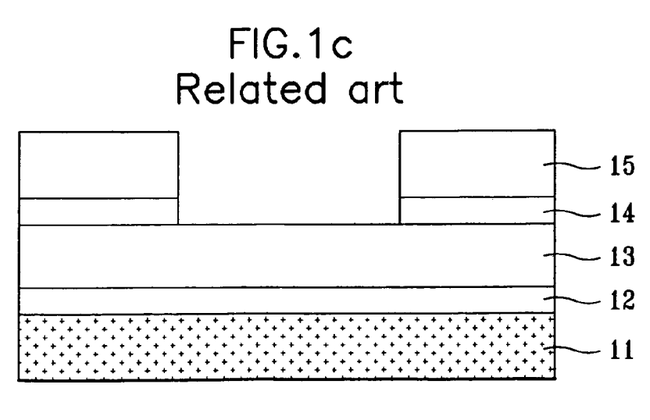

Afterwards, as shown in FIG. 1c, the substrate 11 is loaded into etching equipment, and beta-diketone vapor is implanted into the substrate 11 under the ambient temperature of 100~450° C. to remove the metal oxide 17.

Figure 1D:
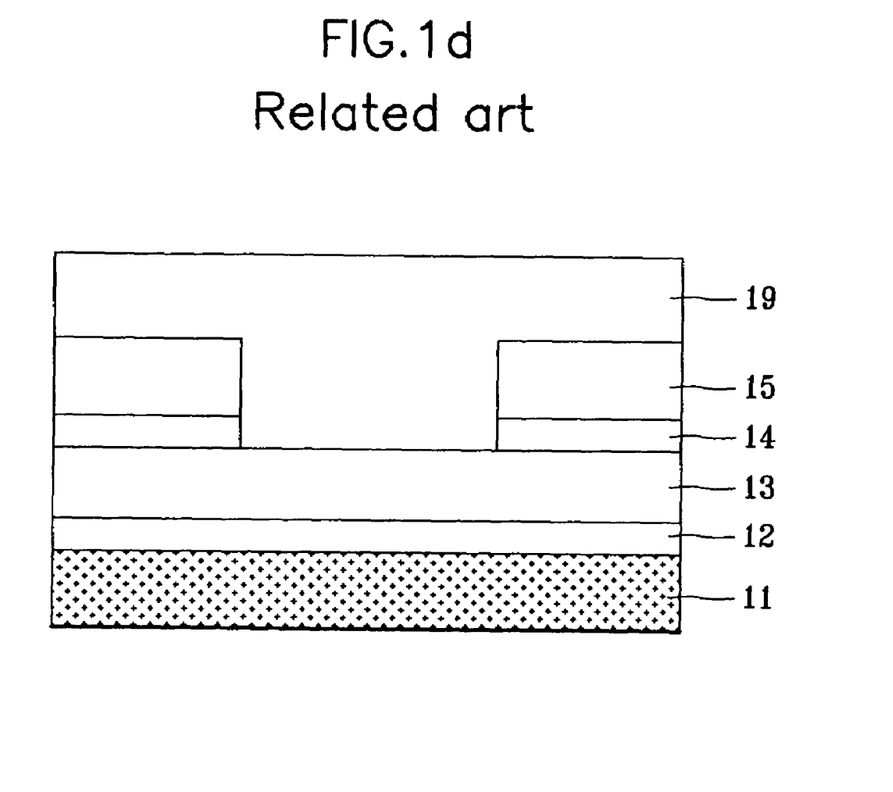

Finally, after the substrate 11 is loaded into the CVD equipment, a second metal layer 19 is formed. Thus, the related art process for forming a thin film is completed.

At this time, the substrate 11 is loaded into the CVD equipment after additional processes, such as washing, rinsing, and drying, are performed. This complicates the whole process.

The first metal layer 13 and the second metal layer 19 are formed of copper which will be expected to substitute for aluminum as a line material of a semiconductor device or a liquid crystal display device.

However, the related art method for forming a thin film has several problems.

First, in case the metal, specifically copper, is formed by the CVD process, resistivity of a copper film increases and foreign substances may contaminate the copper film during the process steps. Also, surface uniformity is too poor to control following process steps.

Furthermore, although an oxide film is etched in the etching equipment, a new oxide film grows during loading from the etching equipment into deposition equipment, which is separate from the etching equipment. A number of processes such as washing, rinsing and drying are required to remove the oxide film. For this reason, the number of steps in the whole process increases. This could lead to increased processing time and production cost.

SUMMARY OF THE INVENTION

An object of the invention is to solve at least the above problems and/or disadvantages and to provide at least the advantages described hereinafter.

Another object of the present invention is to provide a method for forming a thin film and a method for fabricating a liquid crystal display device using the same, in which a process is simplified and surface uniformity of a thin film is improved to obtain a process margin.

Additional features and advantages of the invention will be set forth in the description which follows, and in part will be apparent from the description, or may be learned by practice of the invention. The objectives and other advantages of the invention will be realized and attained by the scheme particularly pointed out in the written description and claims hereof as well as the appended drawings.

To achieve these and other advantages and in accordance with the purpose of the present invention, as embodied and broadly described, a method for forming a thin film according to the present invention includes the steps of forming a diffusion barrier film on a substrate, forming a metal seed layer on the diffusion barrier film, removing a metal oxide film formed on a surface of the metal seed layer using an electric plating method, and depositing metal on the metal seed layer, in which the metal oxide film is removed, using the electric plating method.

In another aspect, a method for fabricating a liquid crystal display device according to the present invention includes the steps of forming a first metal seed layer on a glass substrate, depositing a first metal layer using an electric plating method, patterning the first metal seed layer and the first metal layer to form a gate line and a gate electrode, forming a gate insulating film on an entire surface including the gate line, forming a semiconductor layer on the gate electrode, forming a second metal seed layer on the entire surface including the semiconductor layer, depositing a second metal layer using the electric plating method, patterning the second metal seed layer and the second metal layer to form a data line crossing the gate line and source/drain electrodes on the semiconductor layer, and forming a pixel electrode connected with the drain electrode, on a passivation film formed on the entire surface including the data line.

The method for forming a thin film according to the present invention is characterized in that washing and deposition processes are performed by one piece of equipment to reduce the number of process steps, and potential and pH are properly controlled to grow copper, thereby obtaining a copper thin film having excellent film characteristic. At this time, copper deposition is performed under low pH and negative potential using an electric plating method.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

The invention will be described in detail with reference to the following drawings in which like reference numerals refer to like elements wherein.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for forming a thin film according to the present invention will be described with reference to FIGS. 2a–2c.

Figure 2A:
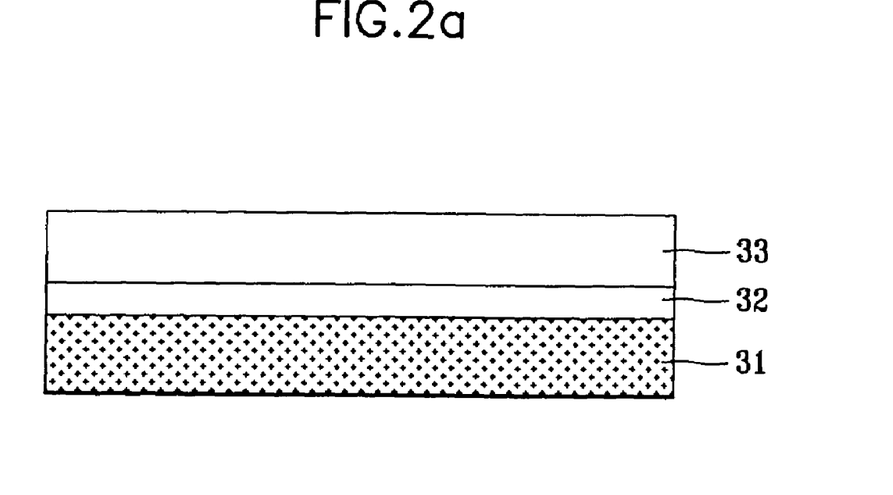
FIGS. 2a to 2c are sectional views illustrating a method for forming a copper thin film according to the present invention.

As shown in FIG. 2a, a diffusion barrier film 32 is formed on a substrate 31, and a seed layer 33 for growing copper is formed on the diffusion barrier film 32.

At this time, since the seed layer 33 is exposed to the air, a copper oxide film is formed on a surface of the seed layer 33.

Figure 2B:
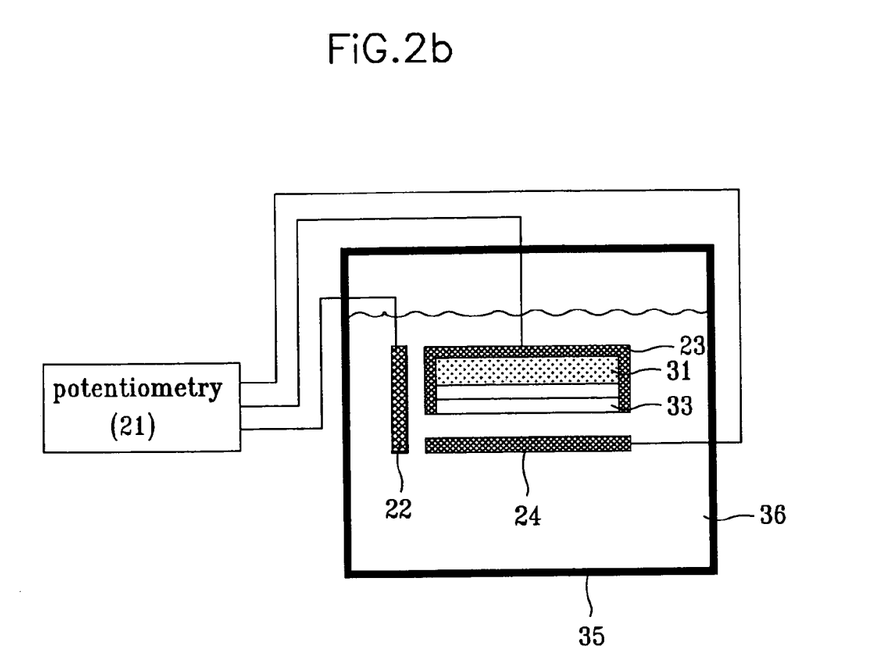
Figure 2C:
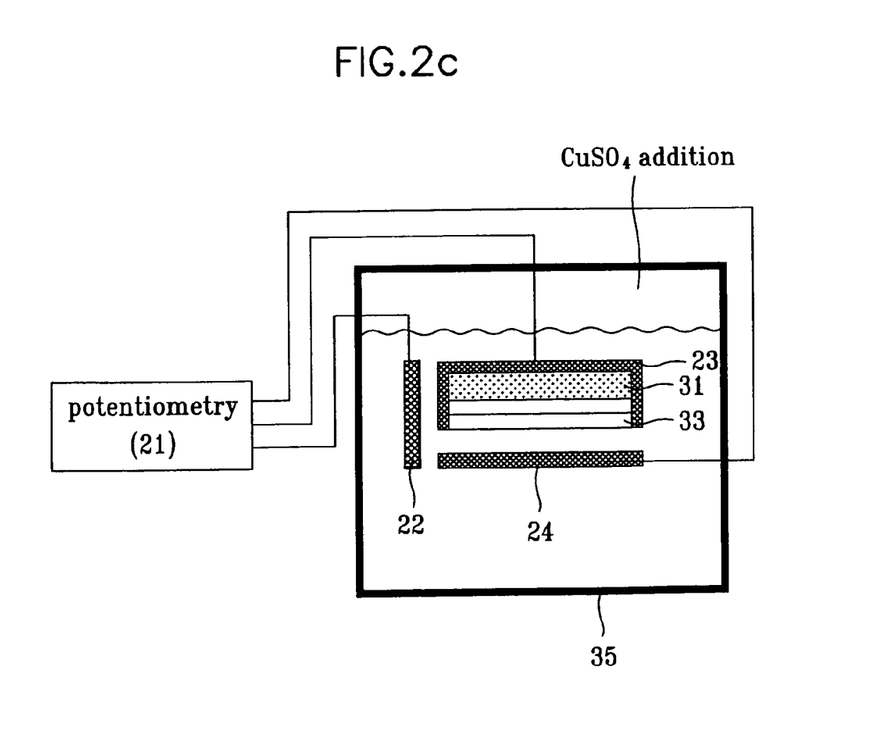

Subsequently, as shown in FIG. 2b, the substrate 31 is dipped in a tub 35 containing an electrolyte solution 36 with $H_2SO_4$ and $H_2O$, so that the copper oxide film formed on the surface of the seed layer 31 is removed.

In the tub 35, there are a reference electrode 22, a working electrode 23, and a counter electrode 24 opposing the working electrode 23. The reference electrode 22, the working electrode 23, and the counter electrode 24 are connected with potentiometers 21. The substrate 31 is arranged in the working electrode 23.

Negative potential flows from the potentiometer 21 to the working electrode 23, while positive potential flows to the counter electrode 24. At this time, current density is within the range of 10~100 $\mu A/cm^2$.

Figure 3:
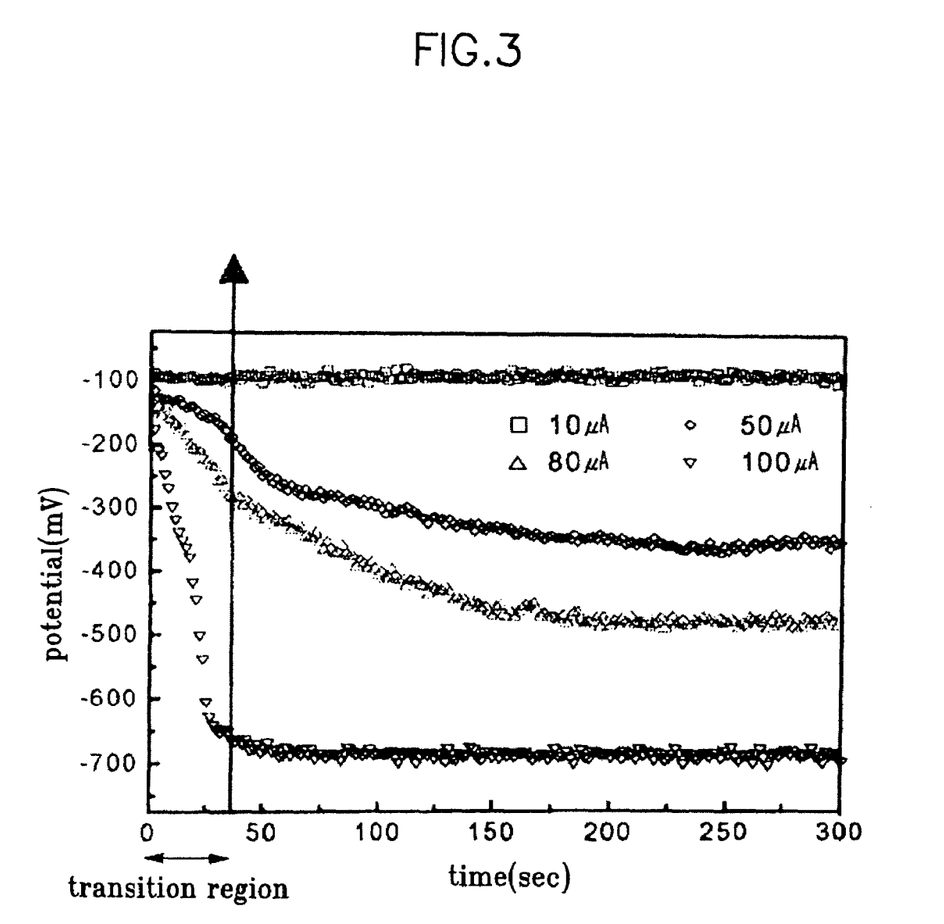
FIG. 3 is a graph showing a temporally variable voltage or current applied when performing an electric plating method according to the present invention.

The electrolyte solution 36 is an acid solution containing no copper and acts as a reducing agent to reduce the copper oxide film to a copper layer at a temperature of 25~100° C. At this time, the reaction formula is as follows and also is shown in FIG. 3.

$$Cu_2O+2e^- \rightarrow 2Cu+O_2^- \quad (1)$$

Referring to the reaction formula (1), a material of the copper oxide film formed on the surface of the seed layer is reduced to copper in the reducing agent, i.e., the electrolytic solution 36, by the negative potential applied from the working electrode 23. This is shown in a transition region of FIG. 3.

In other words, the copper oxide film is completely removed when the transition region ends.

After the copper oxide film formed on the surface of the seed layer 33 is removed, $CuSO_4$ is further added to the tub 35 containing the electrolytic solution 36. Then, a copper film is grown using the seed layer 33 as a medium.

At this time, the negative potential is applied to the working electrode 23, and the process temperature is maintained within the range of about 25~100° C.

As described above, since the process for removing an oxide film and the process for growing a copper film are performed in one tub, excellent film characteristics can be obtained.

Meanwhile, in addition to in-situ method as above, the two processes may be performed by ex-situ method. In the ex-situ method, two chambers can be provided in one tub so that an electrolytic solution is prepared in the first chamber while a deposition solution for growing a metal layer is prepared in the second chamber. Then, a substrate is dipped in the first and second chambers in turn by a robot arm.

Figure 4A:
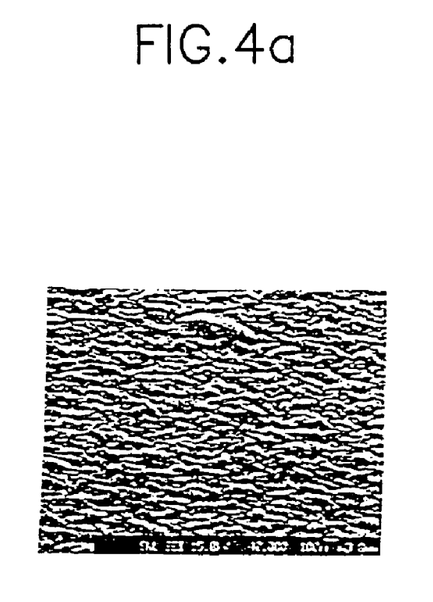
FIG. 4a is a scanning electron microscope (SEM) photograph showing a surface of a copper thin film deposited by a related art wet etching method.
Figure 4B:
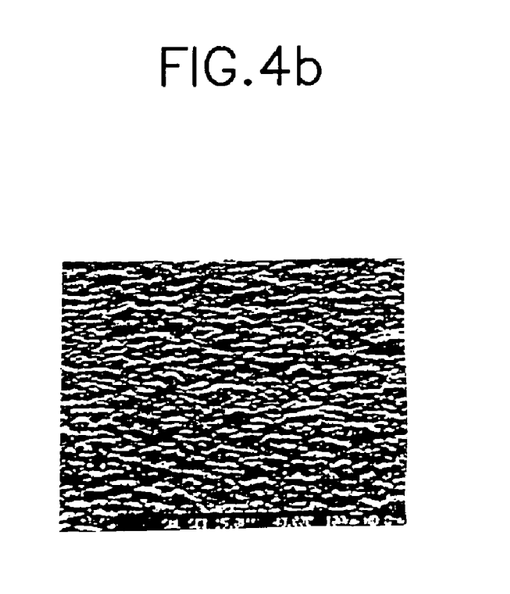
FIG. 4b is an SEM photograph showing a surface of a copper thin film deposited by an electric plating method according to the present invention.

The thin film formed as above has excellent film characteristics in resistivity, reduced contamination by foreign materials, and improved surface state, as compared with the thin film formed by the related art wet chemical etching method (see FIGS. 4a and 4b).

In addition to copper, a metal such as aluminum, molybdenum and chromium may be used as a material of the metal thin film formed by the electric plating method. In this case, the electrolytic solution acts to reduce the metal oxide film to a metal layer using an acid solution having low pH, so as to indirectly remove the oxide film. The deposition solution includes a metal which is to be deposited and does not react with the electrolytic solution, so that the metal film is grown on the surface of the seed layer. Also, the potential of the working electrode is negative to draw a metal ion which exists within the deposition solution in a positive ion state.

Based on the aforementioned method for forming a thin film, a method for fabricating a liquid crystal display device will be described with reference to FIGS. 5a and 5g.

Figure 5A:
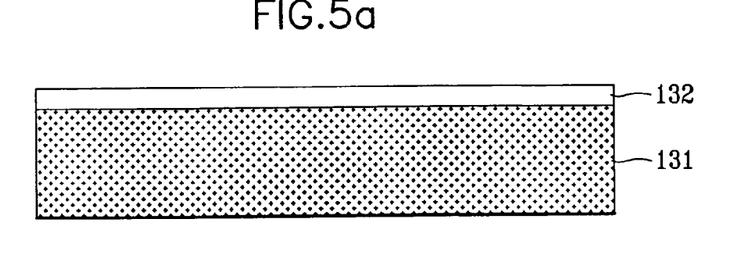
FIGS. 5a to 5g are sectional views illustrating a method for fabricating a liquid crystal display device according to the present invention.
Figure 5B:
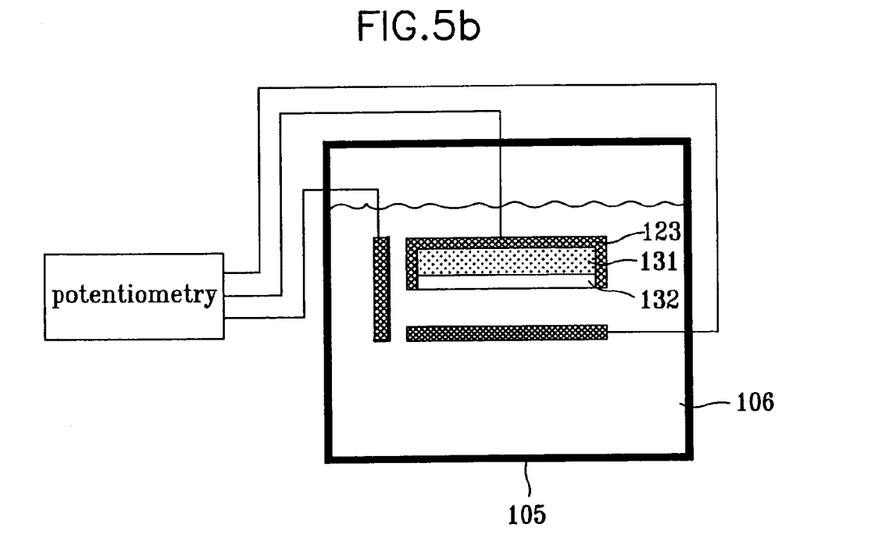
Figure 5C:
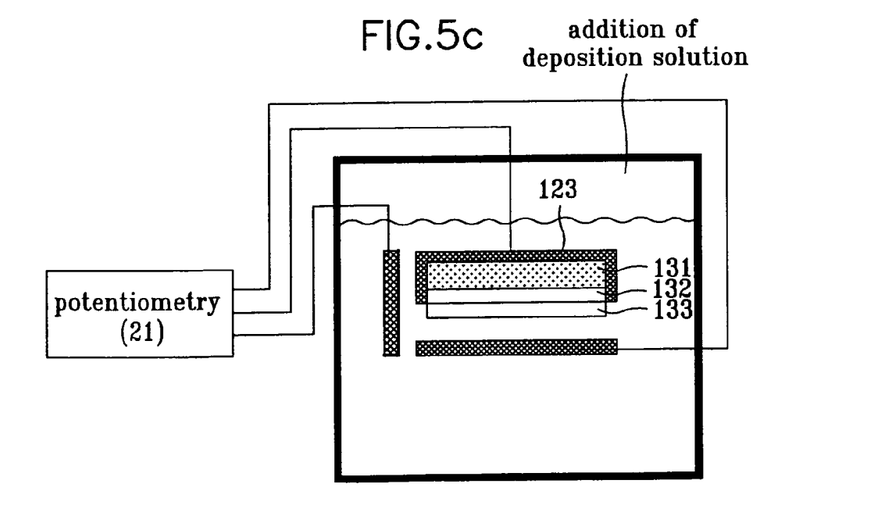

As shown in FIG. 5a, a first metal seed layer 132 is formed on a transparent glass substrate 131. As shown in FIGS. 5b and 5c, a first metal layer 133 is deposited on the first metal seed layer 132 using an electric plating method. For deposition of the metal layer using the electric plating method, a conductive material such as the metal seed layer 132 is required. Also, since an oxide film is formed on the metal seed layer 132, a washing process is required before the first metal layer 133 is deposited on the first metal seed layer 132.

In the present invention, the washing process is performed within one piece of metal deposition equipment without being performed in separate equipment as in the related art.

In other words, a substrate 131 provided with the first metal seed layer 132 is arranged in a tub 105 containing an electrolytic solution 106 to remove the oxide film on a surface of the first metal seed layer 132. A deposition solution is added to the tub 105 to deposit the first metal layer 133 on the first metal seed layer 132.

At this time, the negative potential is applied to the substrate 131 through the working electrode 123.

Figure 5D:
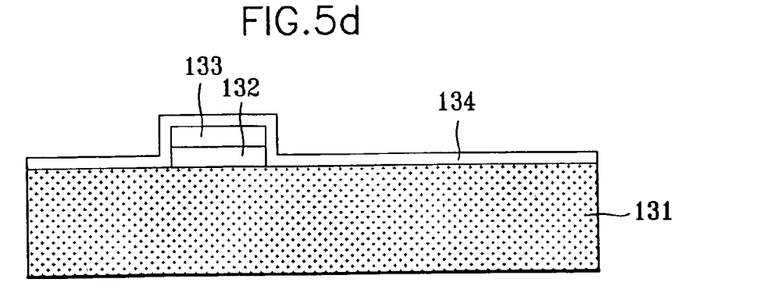

Then, as shown in FIG. 5d, the first metal seed layer 132 and the first metal layer 133 are patterned to form a gate line and a gate electrode, and a gate insulating film 134 is formed on an entire surface including the gate line.

Figure 5E:
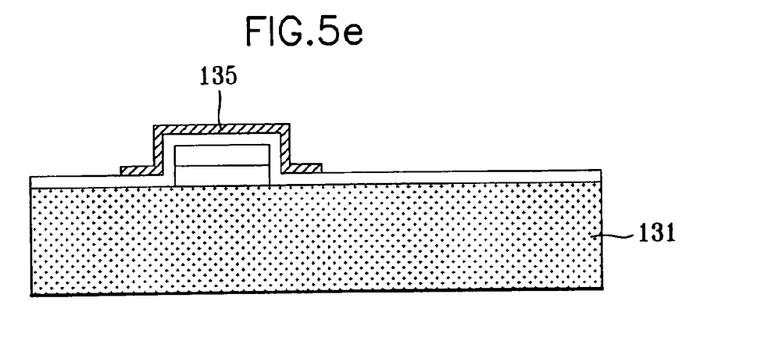

Afterwards, as shown in FIG. 5e, a semiconductor layer 135 is formed on the gate electrode.

Figure 5F:
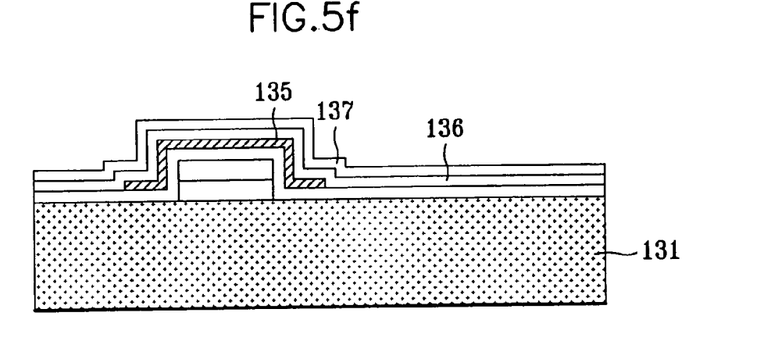

As shown in FIG. 5f, a second metal seed layer 136 is formed on the entire surface including the semiconductor layer 135, and a second metal layer 137 is deposited on the second metal seed layer 136 using the electric plating method. At this time, pH and potential are properly controlled to remove an oxide film formed on the second metal seed layer 136. The second metal layer 137 is then deposited on the second metal seed layer 136.

Figure 5G:
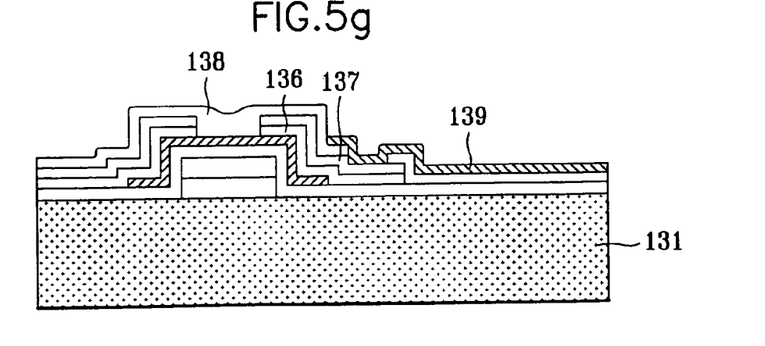

Subsequently, as shown in FIG. 5g, the second metal seed layer 136 and the second metal layer 137 are patterned to form a data line and source/drain electrodes.

At this time, the data line is formed to cross the gate line to separate a unit pixel region, and the source/drain electrodes are formed on the semiconductor layer. Thus, a thin film transistor consisting of the gate electrode, the semiconductor layer and the source/drain electrodes is completed.

A passivation film 138 is formed on the entire surface including the data line, and a pixel electrode 139 electrically connected with the drain electrode is formed on the passivation film 138.

Finally, another substrate including a color filter layer and a common electrode is formed to oppose the glass substrate. A liquid crystal is formed between the two substrates. Thus, the liquid crystal display device according to the present invention is completed.

As described above, the first and second metal layers 133 and 137 are formed of copper, aluminum, chromium, molybdenum, tungsten or an Al alloy. The first and second metal seed layers 132 and 136 are formed of a metal material containing the metal of the first and second metal layers to be deposited thereon.

As aforementioned, the method for forming a thin film and the method for fabricating a liquid crystal display device using the same have the following advantages.

First, since the washing process is performed in the tub for growing a metal thin film, no wet etching equipment is required, unlike the related art. This omits further processes such as washing, rinsing and drying, thereby simplifying the process steps.

Second, the metal thin film formed by the electric plating method has a more uniform thin film than a metal thin film formed after the related art wet etching process. This improves reliability of the device.

Finally, if the liquid crystal display device is fabricated using the electric plating method, the process (i.e., washing process) for removing the metal oxide film formed on the metal seed layer and the process for depositing metal are performed within one tub. Accordingly, the simplified process and excellent thin film characteristic can be obtained.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a liquid crystal display device comprising:
    forming a first metal seed layer on a glass substrate;
    depositing a first metal layer on the first metal seed layer using an electric plating method;
    patterning the first metal seed layer and the first metal layer to form a gate line and a gate electrode;
    forming a gate insulating film on an entire surface including the gate line;
    forming a semiconductor layer on the gate electrode;
    forming a second metal seed layer on the entire surface including the semiconductor layer;
    depositing a second metal layer on the second metal seed layer using the electric plating method;
    patterning the second metal seed layer and the second metal layer to form a data line crossing the gate line and source/drain electrodes on the semiconductor layer; and
    forming a pixel electrode connected with the drain electrode, on a passivation film formed on the entire surface including the data line,
    wherein the electric plating method includes the steps of:
        arranging the substrate in a tub containing an electrolytic solution;
        removing a metal oxide, wherein removing the metal oxide includes applying a first negative potential to the substrate;
        providing a deposition solution to the tub having the electrolytic solution;
        depositing a metal by applying a negative potential to the substrate, wherein depositing the metal includes applying a second negative potential to the substrate.

2. The method of claim 1, wherein the electric plating method is performed in such a manner that pH and potential of the electrolytic solution are controlled.

3. The method of claim 1, wherein the step of removing the metal oxide film and the step of depositing the metal are performed within different chambers in the tub.

4. The method of claim 1, wherein the electrolytic solution reduces the metal oxide film formed on the surfaces of the first and second metal seed layers to metal layers.

5. The method of claim 1, wherein the electric plating method is performed at a temperature of about 25~100° C.

6. The method of claim 1, wherein the electric plating method is performed within the range of current of about 10~100 µA.

7. The method of claim 1, wherein the deposition solution includes a metal which is the same as the metal of the first and second metal seed layer and does not react with the electrolytic solution.

8. The method of claim 1, further comprising the steps of forming another substrate to oppose the glass substrate and forming a liquid crystal between the two substrates.

9. The method of claim 1, wherein the first and second metal seed layers are formed of a metal material containing metal of the first and second metal layers.

10. The method of claim 1, wherein the first and second metal layers are formed of any one of Cu, Al, Cr, Mo, W, or an Al alloy.

* * * * *